(12) United States Patent
Azuma et al.

(10) Patent No.: US 9,953,946 B2
(45) Date of Patent: Apr. 24, 2018

(54) DIE-BONDING LAYER FORMATION FILM, PROCESSED PRODUCT HAVING DIE-BONDING LAYER FORMATION FILM ATTACHED THERETO, AND SEMICONDUCTOR DEVICE

(71) Applicant: LINTEC CORPORATION, Tokyo (JP)

(72) Inventors: Yuichiro Azuma, Tokyo (JP); Hideaki Suzuki, Tokyo (JP); Naoya Saiki, Tokyo (JP); Yuta Sagawa, Tokyo (JP)

(73) Assignee: LINTEC CORPORATION, Tokyo (JP)

( * ) Notice: Subject to any disclaimer, the term of this patent is extended or adjusted under 35 U.S.C. 154(b) by 0 days.

(21) Appl. No.: 15/125,705

(22) PCT Filed: Mar. 16, 2015

(86) PCT No.: PCT/JP2015/057704
§ 371 (c)(1),
(2) Date: Sep. 13, 2016

(87) PCT Pub. No.: WO2015/141629
PCT Pub. Date: Sep. 24, 2015

(65) Prior Publication Data
US 2017/0005062 A1 Jan. 5, 2017

(30) Foreign Application Priority Data
Mar. 17, 2014 (JP) .................................. 2014-054200

(51) Int. Cl.
*H01L 23/00* (2006.01)
*H01L 21/683* (2006.01)
(Continued)

(52) U.S. Cl.
CPC ................ *H01L 24/29* (2013.01); *C09J 7/02* (2013.01); *C09J 7/0207* (2013.01); *C09J 133/06* (2013.01);
(Continued)

(58) Field of Classification Search
CPC ............................ H01L 21/3043; C09J 7/041
See application file for complete search history.

(56) References Cited

U.S. PATENT DOCUMENTS

2007/0077685 A1* 4/2007 Noda ................ H01L 21/67092
438/107

FOREIGN PATENT DOCUMENTS

| JP | 2004-095844 A | 3/2004 |
| JP | 2005-005355 A | 1/2005 |

(Continued)

OTHER PUBLICATIONS

International Search Report of the International Searching Authority dated Jun. 2, 2015 for the corresponding international application No. PCT/JP2015/057704 (and English translation).

*Primary Examiner* — Moazzam Hossain
*Assistant Examiner* — Farun Lu
(74) *Attorney, Agent, or Firm* — Posz Law Group, PLC

(57) ABSTRACT

A die-bonding layer formation film to be used for fixing a processed product to an adherend, includes an adhesive layer, wherein, the storage elastic modulus has a local minimum value at a temperature within a range of 80° C. to 150° C., wherein the adhesive layer has a shear strength to a peeling strength test substrate of 20 N/2 mm□ [N/(2 mm×2 mm)] or more and 50 N/2 mm□ [N/(2 mm×2 mm)] or less, wherein the shear strength is measured after the processed product is placed above the peeling strength test substrate via the die-bonding layer formation film and the die-bonding layer formation film on the peeling strength test substrate is
(Continued)

heated at 175° C. for 1 hour and then further maintained under an environment of 250° C. for 30 seconds. Bubbles (voids) are unlikely to grow at the boundary between the adhesive layer and an adherend even when subjected to thermal history.

5 Claims, 1 Drawing Sheet

(51) Int. Cl.
  *C09J 7/02* (2006.01)
  *C09J 133/06* (2006.01)
  *C09J 133/12* (2006.01)
(52) U.S. Cl.
  CPC .......... *H01L 21/6836* (2013.01); *H01L 24/32* (2013.01); *H01L 24/48* (2013.01); *H01L 24/73* (2013.01); *C09J 133/12* (2013.01); *C09J 2201/622* (2013.01); *C09J 2203/326* (2013.01); *C09J 2205/102* (2013.01); *C09J 2205/114* (2013.01); *C09J 2433/00* (2013.01); *C09J 2461/00* (2013.01); *C09J 2463/00* (2013.01); *H01L 24/94* (2013.01); *H01L 2221/68327* (2013.01); *H01L 2221/68377* (2013.01); *H01L 2221/68386* (2013.01); *H01L 2224/2919* (2013.01); *H01L 2224/32225* (2013.01); *H01L 2224/73265* (2013.01); *H01L 2224/94* (2013.01); *H01L 2924/00014* (2013.01)

(56) References Cited

FOREIGN PATENT DOCUMENTS

| JP | 2011-116897 | A |   | 6/2011 |
| JP | 2011116897 | A | * | 6/2011 |

* cited by examiner

DIE-BONDING LAYER FORMATION FILM, PROCESSED PRODUCT HAVING DIE-BONDING LAYER FORMATION FILM ATTACHED THERETO, AND SEMICONDUCTOR DEVICE

CROSS REFERENCE TO RELATED APPLICATIONS

This application is a U.S. national stage application of PCT/JP2015/07704 filed on Mar. 16, 2015, which claims priority to Japanese Patent Application No. 2014-054200 filed on Mar. 17, 2014, the contents of which are incorporated herein by reference.

TECHNICAL FIELD

The present invention relates to a die-bonding layer formation film that is used when fixing a processed product (such as a chip) obtained by processing a workpiece such as a semiconductor wafer to an adherend such as a circuit substrate, a sheet for die-bonding layer formation comprising the film, a processed product having the die-bonding layer formation film attached thereto, and a semiconductor device manufactured using the processed product.

BACKGROUND ART

Semiconductor wafers such as silicon and gallium arsenide wafers are manufactured in a large diameter state, and the wafers are cut and separated (diced) into small element pieces (semiconductor chips), which are then transferred to a mounting step as the subsequent step. During this operation, semiconductor wafers are subjected to the steps of dicing, cleaning, drying, expanding, and pickup in a state of being preliminarily attached to adhesive sheets, and these steps are followed by a bonding step as the subsequent step.

To simplify the processes of the pickup step and bonding step among the above steps, there have been proposed various adhesive sheets for dicing/die bonding that have both of a wafer fixing function and a die adhesion function (Patent Literature 1, etc). The adhesive sheet as disclosed in Patent Literature 1 allows so-called direct die bonding and can omit a coating step for adhesive for die adhesion. Such an adhesive sheet may be formed by laminating a die-bonding layer formation film comprising an adhesive layer formed of a specific composition on a pressure sensitive adhesive layer of a pressure sensitive adhesive sheet comprising the pressure sensitive adhesive layer and a base film.

In recent years, based on the fact that a semiconductor device has been manufactured in which a plurality of semiconductor chips are laminated in multiple layers, there is needed a die-bonding layer formation film in which bubbles (voids) are less likely to grow at the boundary with an adherend even when heated. It is expected that a die-bonding layer that is unlikely to delaminate from an adherend can be formed from such a die-bonding layer formation film.

In this regard, Patent Literature 2 discloses a thermosetting-type die-bonding film (die-bonding layer formation film) that is used for fixing a semiconductor chip to an adherend and has at least an adhesive layer. The thermosetting-type die-bonding film has the following features. The adhesive layer contains an epoxy resin and phenol resin as thermoset resins and also contains an acrylic resin having a weight-average molecular weight of 100,000 or more as a thermoplastic resin. When the total weight of the epoxy resin and phenol resin is X and the weight of the acrylic resin is Y, the value X/Y ranges from 0.07 to 0.7. After heating treatment at 175° C. for 1 hour, the decrease ratio of epoxy groups in terms of that before the heating treatment is 60% or less. It is said that the adhesive layer of the die-bonding layer formation film disclosed in Patent Literature 2 can suppress the progress of thermoset reaction at the time of heating and the progress of cross-linking thereby to allow voids to readily disappear due to the heat and pressure during molding even when such voids are generated at the boundary between the adhesive layer and an adherend. In the present description, an "adhesive layer excellent in thermal history resistance" refers to an adhesive layer that allows bubbles (voids) to readily disappear before a die-bonding layer is formed, even when the die-bonding layer formation film receives thermal history, such as heating at 175° C. for 1 hour, to generate bubbles (voids) at the boundary between the adhesive layer of the die-bonding layer formation film and an adherend.

PRIOR ART LITERATURE

Patent Literature

[Patent Literature 1] JP2005-5355A
[Patent Literature 2] JP2011-116897A

SUMMARY OF THE INVENTION

Problems to be Solved by the Invention

As a result of studies by the present inventors, it has been revealed that, according to the adhesive layer comprising a material in which the thermoset reaction at the time of heating is less likely to progress as disclosed in Patent Literature 2, enhancing the suitability for wire bonding may be difficult. In the present description, the suitability for wire bonding means one of properties of an adhesive layer, i.e. a property that, when wire bonding is performed between a processed product (e.g. a chip) and an adherend (e.g. a circuit substrate) which are fixed to each other by a die-bonding layer, the processed product and the adherend can be appropriately connected to each other by wirings. Low suitability for wire bonding of an adhesive layer may increase a risk that a conduction failure or the like occurs between electrodes of the processed product and electrodes of the adherend because the connection reliability of bonding wires may be poor.

The present invention has been made in view of the actual circumstances as the above, and an object of the present invention is to provide a die-bonding layer formation film comprising an adhesive layer that is excellent in the thermal history resistance and in the suitability for wire bonding. Another object of the present invention is to provide a processed product that is manufactured using the above die-bonding layer formation film or a sheet for die-bonding layer formation. A further object of the present invention is to provide a semiconductor device that is manufactured using the processed product.

Means for Solving the Problems

As a result of the inventors' studies to achieve the above objects, there has been obtained a novel knowledge that a die-bonding layer formation film having the following characteristics can be provided with an adhesive layer that is excellent in the thermal history resistance and in the suitability for wire bonding:

(Characteristic 1) When a temperature dependency of the storage elastic modulus of the adhesive layer of the die-bonding layer formation film is measured, the storage elastic modulus has a local minimum value at a temperature within a range of 80° C. to 150° C.

(Characteristic 2) The die-bonding layer formation film has a shear strength to a peeling strength test substrate of 20 N/2 mm□ [N/(2 mm×2 mm)] or more and 50 N/2 mm□ [N/(2 mm×2 mm)] or less, wherein the shear strength is measured after a processed product is placed above the peeling strength test substrate via the die-bonding layer formation film and the die-bonding layer formation film on the peeling strength test substrate is heated at 175° C. for 1 hour and then further maintained under an environment of 250° C. for 30 seconds.

The present invention accomplished based on the above knowledge is as follows:

(1) A die-bonding layer formation film to be used for fixing a processed product to an adherend, the processed product being obtained by processing a workpiece, the die-bonding layer formation film comprising an adhesive layer, wherein, when a temperature dependency of a storage elastic modulus of the adhesive layer is measured, the storage elastic modulus has a local minimum value at a temperature within a range of 80° C. to 150° C., wherein the adhesive layer has a shear strength to a peeling strength test substrate of 20 N/2 mm□ or more and 50 N/2 mm□ or less, wherein the shear strength is measured after the processed product is placed above the peeling strength test substrate via the die-bonding layer formation film and the die-bonding layer formation film on the peeling strength test substrate is heated at 175° C. for 1 hour and then further maintained under an environment of 250° C. for 30 seconds.

(2) The die-bonding layer formation film as described in the above (1), wherein the adhesive layer comprises a binder component that contains a polymer component (A), a curable component (B), and a curing accelerator (B3), wherein a mass ratio of a total amount of the polymer component (A), the curable component (B), and the curing accelerator (B3) in the binder component to a mass of the adhesive layer as a whole is 95 mass % or more.

(3) The die-bonding layer formation film as described in the above (1) or (2), wherein the die-bonding layer formation film is an adhesive film for die bonding that is used for adhesion of a semiconductor chip to a die mounting part.

(4) A processed product having a die-bonding layer formation film attached thereto, wherein the processed product is manufactured using the die-bonding layer formation film as described in any one of the above (1) to (3).

(5) A semiconductor device manufactured using the processed product having a die-bonding layer formation film attached thereto as described in the above (4), the semiconductor device having a structure in which the processed product and an adherend are laminated via a die-bonding layer, the semiconductor device comprising a wire for connection between the processed product and the adherend.

Advantageous Effect of the Invention

The adhesive layer of the die-bonding layer formation film according to the present invention is excellent in the thermal history resistance and in the suitability for wire bonding. Therefore, by using the die-bonding layer formation film according to the present invention, it is possible to obtain a semiconductor device that has high adhesion reliability of the die bonding layer and high connection reliability of the bonding wire. Moreover, according to the present invention, there can be provided a processed product manufactured using the above die-bonding layer formation film and a semiconductor device manufactured using the processed product.

BEST MODE(S) FOR CARRYING OUT THE INVENTION

Figure 1:
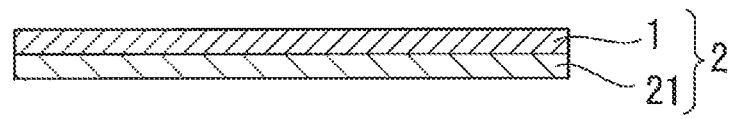
FIG. 1 is a cross-sectional view of a sheet for die-bonding layer formation according to an embodiment of the present embodiment.

Embodiments of the present invention will be described hereinafter.

1. Die-bonding Layer Formation Film

The die-bonding layer formation film according to the present embodiment is for forming a die-bonding layer that is used when fixing a processed product (such as a chip) obtained by processing a workpiece (such as a semiconductor wafer) to an adherend (such as a circuit substrate). The die-bonding layer formation film comprises an adhesive layer and may have a single-layer structure of the adhesive layer or a multilayer structure.

When the die-bonding layer formation film has a multilayer structure, the specific structure is not limited. For example, the die-bonding layer formation film may have a laminate structure in which adhesive layers are formed on both surfaces of a core material. Examples of the core material include: films (such as polyimide film, polyethylene terephthalate film, polyethylene naphthalate film, and polycarbonate film); resin substrates reinforced with glass fibers and/or plastic nonwoven fibers; silicon substrates; and glass substrates. The following description will be directed to a specific example of a case in which the die-bonding layer formation film has a single-layer structure that comprises an adhesive layer.

Method of forming a die-bonding layer from the die-bonding layer formation film is not limited. One example may be such that the adhesive layer of the die-bonding layer formation film is made to contain a thermoset material and the adhesive layer is heated to form a die-bonding layer. Another example may be such that the adhesive layer of the die-bonding layer formation film is made to contain an energy ray curable material and the adhesive layer is irradiated with an energy ray to form a die-bonding layer.

When the workpiece is a semiconductor wafer and the processed product obtained by processing the workpiece is a semiconductor chip, the die-bonding layer may be formed at the side of the semiconductor wafer on which electrodes such as bumps are not formed, and electrodes of a chip formed from the semiconductor wafer may be connected by wire bonding to electrodes of an adherend to which the chip is fixed by the die-bonding layer. The adhesive layer of the die-bonding layer formation film according to the present embodiment is excellent in the thermal history resistance, and therefore the die-bonding layer formed from such a die-bonding layer formation film can have high adhesion reliability.

The die-bonding layer formation film may be required to have at least the following three functions:
(Function 1) Sheet shape maintaining property
(Function 2) Initial adhesion property
(Function 3) Curability The adhesive layer of the die-bonding layer formation film may preferably have all of these three functions. In particular, when the die-bonding layer formation film comprises a single-layer structure of the adhesive layer, the adhesive layer may have to have all the above three functions.

The physical properties and composition of the adhesive layer of the die-bonding layer formation film will be described below.

(1) Physical Properties (1-1) Local Minimum Elasticity Temperature

When the temperature dependency of a storage elastic modulus is measured for the adhesive layer of the die-bonding layer formation film according to the present embodiment, the storage elastic modulus has a local minimum value at a temperature within a range of 80° C. to 150° C. In the present description, the temperature at which the storage elastic modulus of the adhesive layer comes to the local minimum value is referred also to as a "local minimum elasticity temperature."

According to the feature that the local minimum elasticity temperature is 80° C. or higher, it is easy to adjust a high-temperature shear strength, which will be described later, to an appropriate value, and storage stability of the adhesive layer is unlikely to deteriorate.

According to the feature that the local minimum elasticity temperature is 150° C. or lower, it is possible to enhance the suitability for wire bonding of the adhesive layer of the die-bonding layer formation film. Wire bonding may ordinarily be performed at a temperature of about 170° C. to 180° C. Therefore, when the local minimum elasticity temperature is 150° C. or lower, the storage elastic modulus of the adhesive layer of the die-bonding layer formation film may appropriately be increased during the wire bonding to make it easy to perform suitable wire bonding for a laminate structure comprising the die-bonding layer formation film (the laminate structure may comprise a processed product such as a chip, the die-bonding layer formation film, and an adherend). If the suitability for wire bonding of the adhesive layer is low, troubles are likely to occur, such as that the shear strength of wires (bonding wires) formed by the wire bonding may be low, e.g., specific example of the reduced strength may be less than 10 g.

In view of enhancing the shape stability and suitability for wire bonding of the adhesive layer, the local minimum elasticity temperature may preferably be 90° C. or higher and 140° C. or lower.

In view of making it easy to adjust the local minimum elasticity temperature within the above range, the adhesive layer of the die-bonding layer formation film according to the present embodiment may preferably contain a thermoset material.

(1-2) High-temperature Shear Strength

The adhesive layer of the die-bonding layer formation film according to the present embodiment has a high-temperature shear strength of 20 N/2 mm□ or more and 50 N/2 mm□ or less. The high-temperature shear strength is defined as follows.

In the present description, the high-temperature shear strength means a shear strength of the adhesive layer to a peeling strength test substrate, wherein the shear strength is measured after a processed product is placed above the peeling strength test substrate via the die-bonding layer formation film and the die-bonding layer formation film on the peeling strength test substrate is heated at 175° C. for 1 hour and then further maintained under an environment of 250° C. for 30 seconds. The peeling strength test substrate may specifically be a substrate as described in examples which will be described later.

According to the feature that the high-temperature shear strength of the adhesive layer is 20 N/2 mm□ or more, it is possible to enhance the suitability for wire bonding of the adhesive layer. If the suitability for wire bonding is low, troubles are likely to occur, such as that the shear strength of bonding wires may be low, e.g., specific example of the reduced strength may be less than 10 g.

According to the feature that the high-temperature shear strength of the adhesive layer is 50 N/2 mm□ or less, it is possible to enhance the thermal history resistance of the adhesive layer. If the thermal history resistance of the adhesive layer is low, bubbles (voids) which are generated at the boundary between the adhesive layer and an adherend due to the die-bonding layer formation film being heated are unlikely to disappear. Consequently, when heating treatment such as a reflow process is performed for a semiconductor device comprising the die-bonding layer (the semiconductor device may comprise a laminate structure of a processed product such as a chip, the die-bonding layer, and an adherend), the die-bonding layer is likely to delaminate from the adherend, i.e., the adhesion reliability of the die-bonding layer may be poor.

In view of enhancing the suitability for wire bonding and thermal history resistance of the adhesive layer, the high-temperature shear strength may preferably be 20 N/2 mm□ or more and 40 N/2 mm□ or less and more preferably 20 N/2 mm□ or more and 30 N/2 mm□ or less. When the high-temperature shear strength is a low value within such a range, the thermal history resistance can easily be enhanced even if a mass ratio of the total amount of a polymer component (A), a curable component (B), and a curing accelerator (B3) to a mass of the adhesive layer as a whole is 95 mass % or more, as will be described later.

In view of making it easy to adjust the high-temperature shear strength within the above range, the adhesive layer of the die-bonding layer formation film according to the present embodiment may preferably contain a thermoset material.

(2) Composition of Adhesive Layer

The adhesive layer of the die-bonding layer formation film according to an embodiment of the present invention may preferably contain a binder component. This allows the die-bonding layer formation film to easily have the sheet shape maintaining property (Function 1) and the curability (Function 3).

Specific examples of the binder component include those that contain a polymer component (A) and a thermoset component (B). The binder component may preferably further contain a curing accelerator (B3).

The initial adhesion property (Function 2), which is a function of provisionally fixing the die-bonding layer formation film to a workpiece until the adhesive layer of the die-bonding layer formation film is cured, may be pressure sensitivity or may also be a property of adhering by thermal softening. The initial adhesion property (Function 2) may ordinarily be controlled, such as by various characteristics of the binder component and adjustment of the compounding amount of filler (C) which will be described later.

(A) Polymer Component

The polymer component (A) may be added mainly for the purpose of allowing the adhesive layer to have the sheet shape maintaining property.

To achieve the above purpose, the weight-average molecular weight (Mw) of the polymer component (A) may ordinarily be 20,000 or more and preferably 20,000 to 3,000,000.

Examples of the polymer component (A) to be used include acrylic polymer, polyester, phenoxy resin, polycarbonate, polyether, polyurethane, polysiloxane, and rubber-based polymer. Combined compound of two or more types thereof may also be used, such as an acrylic urethane resin obtained by reacting urethane prepolymer having an isocyanate group at the molecular end with acrylic polyol that is an acrylic polymer having a hydroxyl group. Combination of two or more types thereof may also be used, including a polymer obtained by combining two or more types.

(A1) Acrylic Polymer

An acrylic polymer (A1) may preferably be used as the polymer component (A). The glass-transition temperature (Tg) of the acrylic polymer (A1) may preferably be within a range of −60° C. to 50° C., more preferably within a range of −50° C. to 40° C., and further preferably within a range of −40° C. to 30° C. If the glass-transition temperature (Tg) of the acrylic polymer (A1) is high, the adhesion property of the adhesive layer will deteriorate to lead to troubles, such as that the die-bonding layer formation film cannot be transferred to a workpiece and the die-bonding layer formation film may delaminate from a workpiece after being transferred.

The weight-average molecular weight (Mw) of the acrylic polymer (A1) may preferably be 100,000 to 1,500,000. If the weight-average molecular weight (Mw) of the acrylic polymer (A1) is high, the adhesion property of the adhesive layer will deteriorate to lead to troubles, such as that the die-bonding layer formation film cannot be transferred to a workpiece and the die-bonding layer formation film may delaminate from a workpiece after being transferred.

The acrylic polymer (A1) may contain (meth) acrylic ester monomer or a derivative thereof at least as a constituent monomer. Examples of the (meth)acrylic ester monomer to be used include alkyl (meth)acrylate of which the carbon number of alkyl group is 1 to 20, cycloalkyl (meth)acrylate, and benzyl (meth)acrylate. Among them, alkyl (meth)acrylate of which the carbon number of alkyl group is 1 to 18 may particularly preferably be used, such as methyl (meth) acrylate, ethyl (meth)acrylate, propyl (meth)acrylate, n-butyl (meth)acrylate, 2-ethylhexyl (meth)acrylate, decyl acrylate, lauryl acrylate, and stearyl acrylate. The constituent unit of the acrylic polymer (A1) may originate from a functional group-containing monomer, and such a monomer may preferably be a monomer that has a polymerizable double bond and a functional group, such as hydroxyl group, amino group, substituted amino group and epoxy group, in a molecule. Non-acrylic-based monomer such as vinyl acetate and styrene may also be copolymerized as another monomer.

Further specific examples of the above functional group-containing monomer include: hydroxyl group-containing monomer, such as 2-hydroxyethyl (meth)acrylate, 2-hydroxypropyl (meth)acrylate, 3-hydroxypropyl (meth)acrylate and 4-hydroxybutyl (meth)acrylate; and epoxy group-containing monomer, such as glycidyl (meth)acrylate. They may be used alone or two or more types may be used in combination.

A monomer having a carboxyl group may also be used as the monomer that constitutes the acrylic polymer (A1), but the use amount of the monomer having a carboxyl group may preferably be small because, when an epoxy-based thermoset component is use as a thermoset component (B) which will be described later, the carboxyl group may react with an epoxy group in the epoxy-based thermoset component.

When the adhesive layer contains a cross-linker (E) which will be described later, the acrylic polymer (A1) may preferably have a reactive functional group, such as by containing a constituent unit originated from the above-described functional group-containing monomer.

In particular, an acrylic polymer (A1) having hydroxyl group as the reactive functional group may be preferred because the production is easy and it is also easy to introduce a cross-linked structure using a cross-linker (E). In addition, the acrylic polymer (A1) having hydroxyl group is excellent in the compatibility with a thermoset component (B) which will be described later.

When a reactive functional group is introduced into the acrylic polymer (A1) by using a monomer having a reactive functional group as the monomer that constitutes the acrylic polymer (A1), the ratio of the monomer having a reactive functional group in the total mass of the monomer that constitutes the acrylic polymer (A1) may preferably be about 1 to 20 mass % and more preferably 3 to 15 mass %. According to the feature that the constituent unit originated from the monomer having a reactive functional group in the acrylic polymer (A1) is within the above range, the reactive functional group can react with a crosslinkable functional group of the cross-linker (E) to form a three-dimensional network structure, thereby to increase the crosslink density of the acrylic polymer (A1). As a result, it is easy to increase the shear strength of a die-bonding layer formed from the die-bonding layer formation film comprising the adhesive layer. Moreover, it may also be easy to adjust the high-temperature shear strength of the adhesive layer within the above-described range. Furthermore, the water absorbability of the adhesive layer may be reduced, and a semiconductor device having excellent package reliability can thus be obtained.

(A2) Non-acrylic-based Resin

One type of a non-acrylic-based resin (A2) may be used alone as the polymer component (A), or a combination of two or more types thereof may also be used as the polymer component (A). The non-acrylic-based resin (A2) may be selected from polyester, phenoxy resin, polycarbonate, polyether, polyurethane, polysiloxane, rubber-based polymer, and combined compound of two or more types thereof. The weight-average molecular weight of such a resin may preferably be 20,000 to 100,000 and further preferably 20,000 to 80,000.

The glass-transition temperature of the non-acrylic-based resin (A2) may preferably be within a range of −30° C. to 150° C. and further preferably within a range of −20° C. to 120° C.

When the non-acrylic-based resin (A2) is used together with the above-described acrylic polymer (A1), the die-bonding layer formation film can be easily released from a pressure sensitive adhesive sheet at the time of transferring the die-bonding layer formation film to a workpiece, and the adhesive layer of the die-bonding layer formation film can follow the transfer surface to suppress the occurrence of voids and the like.

When the non-acrylic-based resin (A2) is used together with the above-described acrylic polymer (A1), the content of the non-acrylic-based resin (A2) may ordinarily be within a range of 1:99 to 60:40 and preferably within a range of 1:99 to 30:70 as the mass ratio (A2:A1) of the non-acrylic-based resin (A2) and the acrylic polymer (A1). According to the feature that the content of the non-acrylic-based resin (A2) is within such a range, the above effect can be obtained.

When an acrylic polymer (A1) having an epoxy group at a side chain or a phenoxy resin is used as the polymer component (A), the epoxy group possessed by the polymer component (A) may contribute to the thermosetting, but in the present invention such a polymer or resin may be treated as the polymer component (A) rather than the thermoset component (B).

(B) Thermoset Component

The thermoset component (B) may be added mainly for the purpose of allowing the adhesive layer to have a thermosetting property.

The thermoset component (B) may preferably contain a compound having an epoxy group (which may simply be described as an "epoxy compound" hereinafter) (B1), and a combination of the epoxy compound (B1) and a thermosetting agent (B2) may preferably be used.

A compound contained in the thermoset component (B) may be used in combination with the polymer component (A). Therefore, in view of suppressing the viscosity of a composition for coating for forming the adhesive layer, improving the handling ability, and the like, the weight-average molecular weight (Mw) thereof may ordinarily be 10,000 or less and preferably 100 to 10,000.

Conventionally-known epoxy compound can be used as the epoxy compound (B1) contained in the thermoset component (B). Specific examples of such an epoxy compound include a polyfunctional-based epoxy resin and an epoxy compound having two or more functional groups in a molecule, such as biphenyl compound, bisphenol A diglycidylether and hydrogenated compound thereof, cresol novolac-type epoxy resin, dicyclopentadiene-type epoxy resin, biphenyl-type epoxy resin, bisphenol A-type epoxy resin, bisphenol F-type epoxy resin, phenylene skeleton-type epoxy resin and phenol novolac-type epoxy resin. One type thereof may be used alone or two or more types may also be used in combination.

An epoxy compound having a reactive double bond group may be used as the epoxy compound (B1). A compound having an aromatic ring may be preferred as the epoxy compound having a reactive double bond group because such a compound can enhance the strength and heat resistance of a die-bonding layer formed from the die-bonding layer formation film. Examples of such a reactive double bond group possessed by the epoxy compound preferably include a vinyl group, allyl group, and (meth)acryloyl group, and more preferably include a methacryloyl group.

Examples of such an epoxy compound having a reactive double bond group include a compound in which a part of epoxy groups of a polyfunctional epoxy compound is transformed into a group that contains a reactive double bond group. Such a compound can be synthesized, for example, by an addition reaction of acrylic acid to an epoxy group. Another example may be a compound in which a group that contains a reactive double bond group is directly coupled to an aromatic ring that constitutes an epoxy resin. Specific product name may be CNA-147 available from Nippon Kayaku Co., Ltd.

The number average molecular weight of the epoxy compound (B1) is not particularly restricted, but may preferably be 300 to 30,000, further preferably 400 to 10,000, and particularly preferably 500 to 3,000, in view of curability of the adhesive layer of the die-bonding layer formation film and the strength and heat resistance of the die-bonding layer.

The thermosetting agent (B2) contained in the thermoset component (B) functions as a curing agent for the epoxy compound (B1). Examples of the thermosetting agent (B2) include a compound having two or more functional groups, in one molecule, which are reactive with epoxy groups. Examples of such functional groups include phenolic hydroxyl group, alcoholic hydroxyl group, amino group, carboxyl group, and acid anhydride. Among them, phenolic hydroxyl group, amino group, and acid anhydride may be preferred, and phenolic hydroxyl group and amino group may be further preferred.

Specific examples of a thermosetting agent having an amino group (amine-based thermosetting agent) include DICY (dicyandiamide).

Specific examples of a thermosetting agent having a phenolic hydroxyl group (phenol-based thermosetting agent) include polyfunctional-based phenol resin, biphenol, novolac-type phenol resin, dicyclopentadiene-based phenol resin, and aralkyl phenol resin.

On type of the above may be used alone, or a mixture of two or more types may also be used.

The number average molecular weight of the thermosetting agent (B2) contained in the thermoset component (B) may preferably be 40 to 30,000, further preferably 60 to 10,000, and particularly preferably 80 to 3,000.

The content of the thermosetting agent (B2) in the adhesive layer of the die-bonding layer formation film may preferably be 0.1 to 500 mass parts and more preferably 1 to 200 mass parts with respect to 100 mass parts of the epoxy compound (B1). If the content of the thermosetting agent (B2) is small, an appropriate adhesion property may not be obtained due to insufficient curing. The content of the thermosetting agent (B2) may preferably be 0.2 to 50 mass parts and more preferably 0.5 to 40 mass parts with respect to 100 mass parts of the polymer component (A). If the content of the thermosetting agent (B2) is small, a sufficient adhesion property may not be obtained due to insufficient curing.

The thermoset component (B) may preferably contain the epoxy compound (B1) and the thermosetting agent (B2). The softening point of each of the epoxy compound (B1) and the thermosetting agent (B2) may preferably be 50° C. or higher in consideration that, when the die-bonding layer formation film is attached, the die-bonding layer formation film may be heated thereby to enhance the flowability of the die-bonding layer formation film and improve the suitability for attaching. In the present description, the "softening point" means a value that is measured by the ring-and-ball method in accordance with JIS K 7234: 1986. The softening point of each of the epoxy compound (B1) and the thermosetting agent (B2) may more preferably be 60° C. or higher and particularly preferably 70° C. or higher. The upper limit of the softening point of each of the epoxy compound (B1) and the thermosetting agent (B2) may be appropriately set such that the local minimum elasticity temperature and high-temperature shear strength of the adhesive layer fall within the previously-described ranges.

(B3) Curing Accelerator

To adjust the curing speed of the adhesive layer of the die-bonding layer formation film, the binder component may further contain a curing accelerator (B3). In particular, the curing accelerator (B3) may preferably be used when an epoxy-based thermosetting component is used as the thermoset component (B).

Preferred examples of the curing accelerator (B3) include: tertiary amines, such as triethylenediamine, benzyldimethylamine, triethanolamine, dimethylaminoethanol and tris(dimethylaminomethyl)phenol; imidazoles, such as 2-methylimidazole, 2-phenylimidazole, 2-phenyl-4-methylimidazole, 2-phenyl-4,5-dihydroxymethylimidazole and 2-phenyl-4-methyl-5-hydroxymethylimidazole; organic phosphines, such as tributylphosphine, diphenylphosphine and triphenylphosphine; and tetraphenylborates, such as tetraphenylphosphoniumtetraphenylborate and triphenylphosphinetetraphenylborate. One type thereof may be used alone or a mixture of two or more types may also be used.

When the curing accelerator (B3) is used, the curing accelerator (B3) may be contained preferably in an amount of 0.01 to 10 mass parts and further preferably in an amount of 0.1 to 1 mass part with respect to the total amount of 100 mass parts of the epoxy compound (B1) and the thermosetting agent (B2). According to the feature that the curing accelerator (B3) is contained in an amount within the above range, the adhesive layer can have an excellent adhesion property even when exposed to a high temperature and high humidity, and high package reliability can be achieved even when the product is exposed to a severe reflow condition. If the content of the curing accelerator (B3) is small, a sufficient adhesion property may not be obtained due to insufficient curing.

The total amount of the epoxy compound (B1), thermosetting agent (B2) and curing accelerator (B3), i.e. the total amount of the thermoset component (B) and curing accelerator (B3) may preferably be less than 25 mass %, more preferably 1 to 20 mass %, and further preferably 3 to 10 mass %, in the total mass of the adhesive layer.

The adhesive layer may contain the thermoset component (B) in an amount preferably within a range of 1 to 35 mass parts, more preferably within a range of 3 to 25 mass parts, and further preferably within a range of 3 to 8 mass parts, with respect to 100 mass parts of the polymer component (A). In particular, when the content of the thermoset component (B) is small, e.g., if the thermoset component (B) is contained in an amount within a range of about 3 to 25 mass parts with respect to 100 mass parts of the polymer component (A), there is a tendency that the following effects can be obtained. That is, after the die-bonding layer formation film is fixed to a processed product (such as a chip) and the processed product (such as a chip) is made to temporarily adhere to an adherend (such as a circuit substrate) via the die-bonding layer formation film, even if the die-bonding layer formation film is heated before curing the adhesive layer of the die-bonding layer formation film, the possibility of occurrence of voids in the adhesive layer may be reduced. Reduced amount of voids allows them to readily disappear, and therefore the content of the thermoset component (B) in the adhesive layer may be adjusted thereby to result in the improvement in the thermal history resistance of the adhesive layer. In particular, when the amount of the thermoset component (B) is relatively small to that of the polymer component (A), it may be easy to enhance the thermal history resistance, as will be described below, even if the mass ratio of the total amount of the polymer component (A), thermoset component (B) and curing accelerator (B3) to the mass of the adhesive layer as a whole is 95 mass % or more.

The mass ratio of the total amount of the polymer component (A), thermoset component (B) and curing accelerator (B3) contained in the binder component to the mass of the adhesive layer as a whole may preferably be 95 mass % or more. In such a preferred case, the adhesive layer may scarcely contain a particle-like material, such as a filler (C) as will be described later, and the possibility that the particle-like material drops off from the die-bonding layer can be reduced. As a result, it is possible to suppress the troubles caused by the particle-like material dropping off in a device in which the processed product after die bonding is mounted.

The adhesive layer of the die-bonding layer formation film may contain the following components in addition to the binder component.

(C) Filler

The adhesive layer of the die-bonding layer formation film may contain a filler (C), but preferably may not contain a filler (C). When the adhesive layer does not contain a particle-like material such as a filler (C), it is possible to eliminate the problem caused by the particle-like material dropping off from the die-bonding layer, as described above. Hereinafter, an embodiment in which the adhesive layer of the die-bonding layer formation film contains a filler (C) will be described. Compounding a filler (C) in the adhesive layer allows the coefficient of thermal expansion to be adjusted in a cured product obtained by curing the adhesive layer, and it may be easy to improve the reliability of a semiconductor device (adhesion reliability of the die-bonding layer) by optimizing the coefficient of thermal expansion of the die-bonding layer relative to a workpiece. It is also possible to reduce the water absorbability of the die-bonding layer.

Examples of the filler (C) include: powders, such as silica, alumina, talc, calcium carbonate, titanium oxide, iron oxide, silicon carbide and boron nitride; beads obtained by making them into spherical form; single crystal fiber; and glass fiber. Among them, silica filler and alumina filler may be preferred. The filler (C) may be used alone, or a mixture of two or more types may also be used.

The content of the filler (C) may preferably be within a range of more than 0 mass % and 30 mass % or less and more preferably within a range of 1 to 5 mass % in the total mass of the adhesive layer.

The surface of the filler (C) used in the present invention may preferably be modified with a compound that has a reactive double bond group. In the present description, a filler of which the surface is modified with a compound having a reactive double bond group will be described as a "filler having a reactive double bond group on the surface." The reactive double bond group possessed by the filler (C) may preferably be a vinyl group, allyl group, or (meth)acryloyl group.

The average particle diameter of the filler (C) may preferably be 0.01 to 5 μm and more preferably 0.01 to 1 μm.

The above "average particle diameter" may be obtained by a particle size distribution meter ("Nanotrac 150" available from NIKKISO CO., LTD.) using a dynamic light scattering method.

(D) Coupling Agent

A coupling agent (D) may be used for improving the attaching property and adhesion property of the adhesive layer of the die-bonding layer formation film to a workpiece and the cohesive property of the adhesive layer. The coupling agent (D) may have a functional group that reacts with an inorganic substance and a functional group that reacts with an organic functional group. By using the coupling agent (D), the water resistance of the die-bonding layer can be improved without detracting the heat resistance. Examples of such a coupling agent include a titanate-based coupling agent, aluminate-based coupling agent, and silane coupling agent. Among them, the silane coupling agent may be preferred.

As the silane coupling agent, a silane coupling agent may preferably be used, of which the functional group that reacts with an organic functional group is a group that reacts with a functional group, such as possessed by the polymer component (A) and thermoset component (B).

Examples of such a silane coupling agent include: a low-molecular silane coupling agent having two or three alkoxy groups, such as γ-glycidoxypropyltrimethoxysilane, γ-glycidoxypropyltriethoxysilane, γ-glycidoxypropylmethyldiethoxysilane, β-(3,4-epoxycyclohexyl)ethyltrimethoxysilane, γ-(methacryloxypropyl)trimethoxysilane, γ-aminopropyltrimethoxysilane, N-6-(aminoethyl)-γ-aminopropyltrimethoxysilane, N-6-(aminoethyl)-γ-aminopropylmethyldiethoxysilane, N-phenyl-γ-aminopropyltrimethoxysilane, γ-ureidepropyltriethoxysilane, γ-melcaptopropyltrimethoxysilane, γ-melcaptopropylmethyldimethoxysilane, methyltrimethoxysilane, methyltriethoxysilane and vinyltrimethoxysilane; bis(3-triethoxysilylpropyl)tetrasulfane; vinyltriacetoxysilane; and imidazolsilane. An oligomer-type silane coupling agent may also be mentioned, which is a condensed product obtained by hydrolysis and dehydration condensation of alkoxy groups of the above low-molecular silane coupling agent having two or three alkoxy groups, a low-molecular silane coupling agent having four alkoxy groups, and the like. In particular, oligomer that is a condensed product obtained by dehydration condensation of a low-molecular silane coupling agent having two or three alkoxy groups and a low-molecular silane coupling agent having four alkoxy groups among the above low-molecular silane coupling agents may be preferred because the alkoxy groups are highly reactive and the oligomer has a sufficient number of organic functional groups. For example, an oligomer that is a copolymer of 3-(2,3-epoxypropoxy) propylmethoxysiloxane and dimethoxysiloxane may be mentioned.

One type thereof may be used alone, or a mixture of two or more types may be used.

The content of the silane coupling agent may ordinarily be 0.1 to 20 mass parts, preferably 0.2 to 10 mass parts, and more preferably 0.3 to 5 mass parts, with respect to 100 mass parts of the binder component. If the content of the silane coupling agent is less than 0.1 mass parts, the above effect may not be obtained, while a content of more than 20 mass parts may cause outgassing.

(E) Cross-linker

A cross-linker (E) may also be added to adjust the initial adhesion force and cohesive force of the adhesive layer of the die-bonding layer formation film. When a cross-linker is compounded, the previously-described acrylic polymer (A1) may contain a reactive functional group.

A polyfunctional compound having reactivity with the reactive functional group possessed by the acrylic polymer (A1) may be used as the cross-linker (E). Examples of such a polyfunctional compound include an isocyanate compound, epoxy compound, amine compound, melamine compound, aziridine compound, hydrazine compound, aldehyde compound, oxazoline compound, metal alkoxide compound, metal chelate compound, metal salt, ammonium salt, and reactive phenol resin.

The isocyanate compound will be described relatively in detail. Specific examples of the isocyanate compound include: aromatic polyisocyanate, such as tolylenediisocyanate, diphenylmethanediisocyanate and xylylenediisocyanate; an alicyclic isocyanate compound, such as dicyclohexylmethane-4,4'-diisocyanate, bicycloheptanetriisocyanate, cyclopentylenediisocyanate, cyclohexylenediisocyanate, methylcyclohexylenediisocyanate and hydrogenated xylylenediisocyanate; and an isocyanate compound having a chain-like skeleton, such as hexamethylenediisocyanate, trimethylhexamethylenediisocyanate and lysineisocyanate. There may also be used biuret products and isocyanurate products of these compounds, and modified products such as adduct products that are reaction products of these compounds and non-aromatic low-molecule active hydrogen-containing compounds such as ethylene glycol, trimethylol propane and castor oil. The polyisocyanate compound may be constituted of one type of substance or may also be constituted of two or more types of substances.

When an isocyanate-based cross-linker is used, it is preferred to use an acrylic polymer (A1) that has a hydroxyl group as the reactive functional group. When the cross-linker (E) has an isocyanate group and the acrylic polymer (A1) has a hydroxyl group, the cross-linker (E) reacts with the acrylic polymer (A1), so that a crosslink structure can easily be introduced into the adhesive layer.

When the cross-linker (E) is used, the content of the cross-linker (E) to be used may ordinarily be 0.01 to 20 mass parts, preferably 0.1 to 10 mass parts, and more preferably 0.5 to 5 mass parts, with respect to 100 mass parts of the acrylic polymer (A1).

(F) Photopolymerization Initiator

A photopolymerization initiator (F) may also be compounded in the adhesive layer of the die-bonding layer formation film. Containing the photopolymerization initiator (F) is advantageous because, after a dicing/die-bonding sheet formed of a sheet for die-bonding layer formation comprising the die-bonding layer formation film is attached to a wafer, the dicing/die-bonding sheet can be irradiated with an ultraviolet ray before the dicing step thereby to react the reactive double bond group, for example, possessed by the epoxy compound or the like having the reactive double bond group. This allows preliminary curing.

Performing the preliminary curing provides the following advantages. The adhesive layer of the die-bonding layer formation film is relatively soft before being cured, and therefore the attaching property to a wafer is good. During the dicing, the adhesive layer can have moderate hardness thereby to prevent the die-bonding layer formation film (in particular the adhesive layer) from attaching to a dicing blade and also to prevent other troubles. Furthermore, the preliminary curing enables control and the like of the releasability at the interface between the pressure sensitive adhesive sheet and the die-bonding layer formation film. In addition, the working stability during the wire bonding can be further improved because the hardness increases in the preliminarily cured state compared with the uncured state.

Specific examples of the photopolymerization initiator (F) include benzophenone, acetophenone, benzoin, benzoin methyl ether, benzoin ethyl ether, benzoin isopropyl ether, benzoin isobutyl ether, benzoin benzoic acid, benzoin methyl benzoate, benzoin dimethyl ketal, 2,4-diethylthioxanthone, 1-hydroxycyclohexylphenylketone, benzyl diphenyl sulfide, tetramethyl thiuram monosulfide, azobisisobutyronitrile, benzyl, dibenzyl, diacetyl, β-chloroanthraquinone, (2,4,6-trimethylbenzyldiphenyl) phosphine oxide, 2-benzothiazole-N,N-diethyldithiocarbamate, oligo{2-hydroxy-2-methyl-1-[4-(1-propenyl)phenyl]propanone}, and 2,2-dimethoxy-1,2-diphenylethane-1-one. These may be used alone, or two or more types may also be used in combination.

When the photopolymerization initiator (F) is used, the compounding ratio may ordinarily be 0.1 to 10 mass parts and preferably 1 to 5 mass parts, for example, with respect to 100 mass parts of the epoxy compound having a reactive double bond group. If the content of the photopolymerization initiator (F) is below the above range, sufficient reaction may not be obtained due to insufficient photopolymerization, while if the content is beyond the above range, residual materials that do not contribute to the photopolymerization may be generated to cause an insufficient hardening property of the adhesive layer.

(G) General Additives

In addition to the above, various additives may be compounded as necessary in the adhesive layer of the die-bonding layer formation film. Examples of such additives include a leveling agent, plasticizer, antistatic, antioxidant, ion trapping agent, gettering agent, chain transfer agent, and release agent.

The adhesive layer of the die-bonding layer formation film may be obtained, for example, using a composition (composition for die-bonding layer formation) that is obtained by mixing the above components in an appropriate ratio. The composition for die-bonding layer formation may be preliminarily diluted with a solvent or may also be added to a solvent when being mixed. In an alternative embodiment, the composition for die-bonding layer formation may be diluted with a solvent when being used.

Examples of such a solvent include ethyl acetate, methyl acetate, diethyl ether, dimethyl ether, acetone, methyl ethyl ketone, acetonitrile, hexane, cyclohexane, toluene, and heptane.

The adhesive layer of the die-bonding layer formation film may have an initial adhesion property (such as pressure sensitivity or thermal adhesion property) and curability. When the adhesive layer has pressure sensitivity, the adhesive layer can be attached to a workpiece in the uncured state by being pressed to the workpiece. When the adhesive layer has thermal adhesion property, the die-bonding layer formation film comprising the adhesive layer can be attached to a workpiece by being heated when pressed to the workpiece. The thermal adhesion property in the present invention refers to a property that the adhesive layer does not have pressure sensitivity under an ordinary temperature, but becomes to be able to adhere to a workpiece when softened by heat.

The die-bonding layer formation film can ultimately provide a die-bonding layer having high impact resistance through the curing of the adhesive layer of the die-bonding layer formation film, and the die-bonding layer can have excellent adhesion strength even under a severe condition of high temperature and high humidity.

Moreover, the adhesive layer compounded with a filler having a reactive double bond group on the surface is excellent in the dispersibility of the filler. Therefore, the adhesive layer is unlikely to deform even under a high temperature at which wire bonding is performed, and the wire bonding can be further stably performed. Furthermore, a die-bonding layer having high impact resistance can be ultimately provided through the thermosetting of the adhesive layer, and the die-bonding layer can be excellent in the shear strength and can maintain an excellent adhesion property even under a severe condition of high temperature and high humidity.

The thickness of the adhesive layer of the die-bonding layer formation film may preferably be 1 to 100 μm, more preferably 2 to 90 μm, and particularly preferably 3 to 80 μm. According to the feature that the thickness of the adhesive layer of the die-bonding layer formation film falls within the above range, it is easy to allow the cured product of the adhesive layer of the die-bonding layer formation film to function as a component of a die-bonding layer having high reliability.

2. Sheet for Die-bonding Layer Formation 2

FIG. 1 is a cross-sectional view of a sheet for die-bonding layer formation according to an embodiment of the present embodiment. As illustrated in FIG. 1, the sheet for die-bonding layer formation according to the present embodiment is configured to comprise a die-bonding layer formation film 1 and a release sheet 21 laminated on one surface (lower surface in FIG. 1) of the die-bonding layer formation film 1. The release sheet 21 is to be removed when the sheet for die-bonding layer formation 2 is used.

The release sheet 21 is provided to protect the die-bonding layer formation film 1 until the sheet for die-bonding layer formation 2 is used. The release sheet 21 may be arbitrarily configured, and examples thereof include a plastic film that itself has releasability from the die-bonding layer formation film 1 and a plastic film that has been subjected to release treatment, such as using a release agent. Specific examples of the plastic film include a film of polyester, such as polyethylene terephthalate, polybutylene terephthalate and polyethylene naphthalate, and a film of polyolefin, such as polypropylene and polyethylene. Examples of the release agent to be used include silicone-based, fluorine-based and long-chain alkyl-based ones, among which the silicone-based release agent is preferred because a stable property can be obtained at low cost. The thickness of the release sheet 21 is not particularly restricted, but may ordinarily be about 20 to 250 μm.

Another release sheet 21 as the above may also be laminated on the other surface (upper surface in FIG. 1) of the die-bonding layer formation film 1. In this case, it may be preferred that one release sheet 21 is made to have large release force as a tight release-type release sheet while the other release sheet 21 is made to have small release force as an easy release-type release sheet. When the release force is made different between the release sheets 21 in this manner, the easy release-type release sheet of the sheet for die-bonding layer formation 2 may first be removed, and the exposed surface of the die-bonding layer formation film 1 may be attached to a workpiece such as a semiconductor. Thereafter, the tight release-type release sheet may be removed, and the exposed surface of the die-bonding layer formation film 1 may be attached to a dicing sheet or an adherend.

When the sheet for die-bonding layer formation 2 according to the present embodiment is manufactured, the die-bonding layer formation film 1 may be formed on the release surface (surface having releasability which may be, but is not limited to, a surface that has been subjected to a release treatment) of the release sheet 21. Specific procedure may be as follows. A coating agent for the die-bonding layer formation film is prepared. The coating agent contains a curable adhesive that constitutes the die-bonding layer formation film 1 and may further contain a solvent as necessary. The release surface of the release sheet 21 is coated with the coating agent using a coater, such as a roll coater, knife coater, knife-over-roll coater, air knife coater, die coater, bar coater, gravure coater and curtain coater, and the coating agent is dried to form the die-bonding layer formation film 1.

3. Another Sheet for Die-bonding Layer Formation 3, 3A

Figure 2:
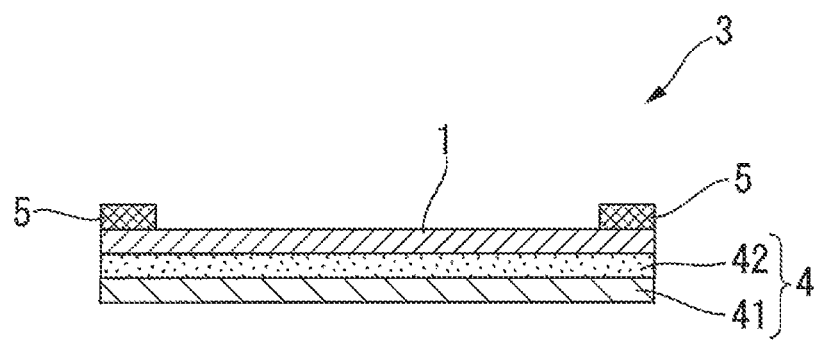
FIG. 2 is a cross-sectional view of a sheet for die-bonding layer formation according to another embodiment of the present embodiment.

FIG. 2 is a cross-sectional view of a sheet for die-bonding layer formation according to another embodiment of the present embodiment. As illustrated in FIG. 2, the sheet for die-bonding layer formation 3 according to the present embodiment is configured to comprise: a pressure sensitive adhesive sheet 4 in which a pressure sensitive adhesive layer 42 is laminated on one surface of a base material 41; a die-bonding layer formation film 1 laminated on the pressure sensitive adhesive sheet 4 at the side of the pressure sensitive adhesive layer 42; and a pressure sensitive adhesive layer for jig 5 laminated on the outer edge portion of the surface of the die-bonding layer formation film 1 at the opposite side to the pressure sensitive adhesive sheet 4. The pressure sensitive adhesive layer for jig 5 is a layer for the sheet for die-bonding layer formation 3 to adhere to a jig such as a ring frame.

The sheet for die-bonding layer formation 3 according to the present embodiment may be used for being attached to a workpiece to hold the workpiece when processing the workpiece and for forming a die-bonding layer on the workpiece or on a processed product obtained by processing the workpiece. The die-bonding layer may be formed from the die-bonding layer formation film 1.

For example, the sheet for die-bonding layer formation 3 according to the present embodiment may be, but is not limited to being, used for holding a semiconductor wafer as a workpiece when dicing the semiconductor wafer and for forming die-bonding layers on semiconductor chips obtained by the dicing. The pressure sensitive adhesive sheet 4 of the sheet for die-bonding layer formation 3 in this case is ordinarily referred to as a dicing sheet.

(1) Pressure Sensitive Adhesive Sheet

The pressure sensitive adhesive sheet 4 of the sheet for die-bonding layer formation 3 according to the present embodiment may be configured to comprise a base material 41 and a pressure sensitive adhesive layer 42 laminated on one surface of the base material 41.

(1-1) Base Material

Constituent materials of the base material 41 of the pressure sensitive adhesive sheet 4 are not particularly limited, provided that the base material 41 is suitable for processing a workpiece, for example, dicing and expanding of a semiconductor wafer. The base material 41 may ordinarily be constituted of a film that comprises a resin-based material as the main material (such a film will be referred to as a "resin film" hereinafter).

Specific examples of the resin film include: polyolefin-based film, such as low-density polyethylene (LDPE) film, linear low-density polyethylene (LLDPE) film, high-density polyethylene (HDPE) film and other polyethylene films, polypropylene film, polybutene film, polybutadiene film, polymethylpentene film, ethylene-norbornene copolymer film and norbornene resin film; ethylene-based copolymer film, such as ethylene-vinyl acetate copolymer film, ethylene-(meth)acrylic acid copolymer film and ethylene-(meth) acrylic ester copolymer film; polyvinyl chloride-based film, such as polyvinyl chloride film and vinyl chloride copolymer film; polyester-based film, such as polyethylene terephthalate film and polybutylene terephthalate film; polyurethane film; polyimide film; polystyrene film; polycarbonate film; and fluorine resin film. There may also be used a modified film thereof, such as a cross-linked film and an ionomer film. The above base material 41 may be a film comprising one type thereof, or may also be a laminated film comprising a combination of two or more types thereof. The "(meth)acrylic acid" as used in the present description means both acrylic acid and methacrylic acid. The same applies to other similar terms.

Among the above, the polyethylene film, polyolefin-based film and ethylene-based copolymer film and cross-linked film or modified film thereof may be preferred, in view of the environment safety, cost, etc.

For the purpose of improving the interfacial adhesion property with the pressure sensitive adhesive layer 42 laminated on the resin film, one surface or both surfaces of the resin film may be subjected to surface treatment, such as using an oxidation method and roughening method, or primer treatment. Examples of the above oxidation method include corona discharge treatment, plasma discharge treatment, chromium oxidation treatment (wet type), flame treatment, hot-air treatment, ozone exposure treatment, and ultraviolet ray irradiation treatment. Examples of the roughening method include a sandblast method and thermal spraying method.

The base material 41 may contain various additives, such as coloring agent, flame retardant, plasticizer, antistatic, glidant, and filler, in the above resin film.

The thickness of the base material 41 is not particularly limited, provided that the sheet for die-bonding layer formation 3 can appropriately function in each step in which it is used. The thickness may preferably be within a range of 20 to 450 µm, more preferably within a range of 25 to 400 µm, and particularly preferably within a range of 50 to 350 µm.

(1-2) Pressure Sensitive Adhesive Layer

The pressure sensitive adhesive layer 42 of the pressure sensitive adhesive sheet 4 of the sheet for die-bonding layer formation 3 according to the present embodiment may be constituted of a non-energy ray curable pressure sensitive adhesive or may also be constituted of an energy ray curable pressure sensitive adhesive. The non-energy ray curable pressure sensitive adhesive may preferably have desired adhesive strength and re-releasability, and examples to be used include an acrylic-based pressure sensitive adhesive, rubber-based pressure sensitive adhesive, silicone-based pressure sensitive adhesive, urethane-based pressure sensitive adhesive, polyester-based pressure sensitive adhesive, and polyvinyl ether-based pressure sensitive adhesive. Among them, the acrylic-based pressure sensitive adhesive may be preferred because it has high adhesion property with the die-bonding layer formation film 1 and can effectively suppress dropping of the workpiece or processed product, such as during the dicing step.

On the other hand, the adhesive strength of the energy ray curable pressure sensitive adhesive may be reduced by energy ray irradiation, and therefore when the workpiece or processed product and the pressure sensitive adhesive sheet 4 are required to be separated from each other, the energy ray irradiation allows easy separation thereof. When the pressure sensitive adhesive layer 42 comprises an energy ray curable pressure sensitive adhesive, the pressure sensitive adhesive layer 42 of the sheet for die-bonding layer formation 3 may be preliminarily cured before being used.

The energy ray curable pressure sensitive adhesive that constitutes the pressure sensitive adhesive layer 42 may comprise a main component that is a polymer having energy ray curability or may also comprise a main component that is a mixture of a polymer without energy ray curability and a polyfunctional monomer and/or oligomer having energy ray curability.

The thickness of the pressure sensitive adhesive layer 42 is not particularly limited, provided that the sheet for die-bonding layer formation 3 can appropriately function in each step in which it is used. Specifically, the thickness may preferably be 1 to 50 µm, particularly preferably 2 to 30 µm, and further preferably 3 to 20 µm.

The pressure sensitive adhesive that constitutes the pressure sensitive adhesive layer for jig 5 may preferably have desired adhesive strength and re-releasability, and examples to be used include an acrylic-based pressure sensitive adhesive, rubber-based pressure sensitive adhesive, silicone-based pressure sensitive adhesive, urethane-based pressure sensitive adhesive, polyester-based pressure sensitive adhesive, and polyvinyl ether-based pressure sensitive adhesive. Among them, the acrylic-based pressure sensitive adhesive may be preferred because it has high adhesion property with a jig such as a ring frame and can effectively suppress removal of the sheet for die-bonding layer formation 3 from the ring frame or the like, such as during the dicing step. A base material as a core may be provided to lie in the middle of the pressure sensitive adhesive layer for jig 5 in its thickness direction.

The thickness of the pressure sensitive adhesive layer for jig 5 may preferably be 5 to 200 µm and particularly preferably 10 to 100 µm in view of the adhesion property to a jig such as a ring frame.

(3) Method of Manufacturing Sheet for Die-bonding Layer Formation 3

The sheet for die-bonding layer formation 3 according to the present embodiment may preferably be manufactured through: separately making a first laminate that includes the die-bonding layer formation film 1 and a second laminate that includes the pressure sensitive adhesive sheet 4; and thereafter using the first laminate and the second laminate to laminate the die-bonding layer formation film 1 and the pressure sensitive adhesive sheet 4 on each other. However, the method of manufacturing is not limited to the above.

When the first laminate is manufactured, the die-bonding layer formation film 1 may be formed on the release surface of a first release sheet. Specific procedure may be as follows. A composition for coating for forming the adhesive layer is prepared. The composition for coating contains the previously-described composition for die-bonding layer formation and may further contain a solvent as necessary. The release surface of the first release sheet is coated with the composition for coating using a coater, such as a roll coater, knife coater, knife-over-roll coater, air knife coater, die coater, bar coater, gravure coater and curtain coater, and the composition for coating is dried to form the die-bonding layer formation film 1. Next, the exposed surface of the die-bonding layer formation film 1 is overlapped with the release surface of a second release sheet so that they are fixed to each other by applying pressure, and a laminate (first laminate) is obtained, in which the die-bonding layer formation film 1 is interposed between the two release sheets. This structure of the first laminate is equivalent to the structure of the previously-described sheet for die-bonding layer formation 2.

In this first laminate, half cutting may be performed if desired, and the die-bonding layer formation film 1 (and the second release sheet) may be formed into a desired shape such as a circular shape. In this case, unnecessary portions of the die-bonding layer formation film 1 and second release sheet generated due to the half cutting may be appropriately removed.

On the other hand, the second laminate may be manufactured as follows. The release surface of a third release sheet is coated with a coating agent for the pressure sensitive adhesive layer, and the coating agent is dried to form the pressure sensitive adhesive layer 42. The coating agent contains a pressure sensitive adhesive that constitutes the pressure sensitive adhesive layer 42 and may further contain a solvent as necessary. Thereafter, the base material 41 is fixed to the exposed surface of the pressure sensitive adhesive layer 42 by applying pressure, and a laminate (second laminate) is obtained, which comprises the pressure sensitive adhesive sheet 4 formed of the base material 41 and pressure sensitive adhesive layer 42 and the third release sheet.

Here, when the pressure sensitive adhesive layer 42 comprises an energy ray curable pressure sensitive adhesive, the pressure sensitive adhesive layer 42 may be irradiated with an energy ray to be cured at this stage, or may otherwise be cured after being laminated with the die-bonding layer formation film 1. When the sheet for die-bonding layer formation 3 is for being attached to a workpiece, such as during the dicing step, and the pressure sensitive adhesive layer 42 is cured after being laminated with the die-bonding layer formation film 1, the pressure sensitive adhesive layer 42 may be cured before the dicing step and the like, or may also be cured after the dicing step and the like.

Ultraviolet ray, electron beam and other irradiation may ordinarily be used as the energy ray. The irradiation amount of the energy ray may be different depending on the type of the energy ray, but when the ultraviolet ray is used, the light amount may preferably be 50 to 1,000 mJ/cm$^2$ and particularly preferably 100 to 500 mJ/cm$^2$. When the electron beam is used, the irradiation amount may preferably be about 10 to 1,000 krad.

After the first laminate and the second laminate are obtained as the above, the second release sheet of the first laminate may be removed while the third release sheet of the second laminate may be removed, and the exposed die-bonding layer formation film 1 of the first laminate may be overlapped with the exposed pressure sensitive adhesive layer 42 of the pressure sensitive adhesive sheet 4 of the second laminate so that they are fixed to each other by applying pressure.

In such a manner, the sheet for die-bonding layer formation 3 can be obtained, which comprises: the pressure sensitive adhesive sheet 4 configured such that the pressure sensitive adhesive layer 42 is laminated on the base material 41; the die-bonding layer formation film 1 laminated on the pressure sensitive adhesive sheet 4 at the side of the pressure sensitive adhesive layer 42; and the first release sheet laminated on the surface of the die-bonding layer formation film 1 at the opposite side to the pressure sensitive adhesive sheet 4. Subsequently, after the first release sheet is removed, the pressure sensitive adhesive layer for jig 5 may be formed on the outer edge portion of the surface of the die-bonding layer formation film 1 at the opposite side to the pressure sensitive adhesive sheet 4. The pressure sensitive adhesive layer for jig 5 can also be formed by coating, using a similar method to that for the above pressure sensitive adhesive layer 42. Half cutting may be performed such that the pressure sensitive adhesive sheet 4, the die-bonding layer formation film 1 and the pressure sensitive adhesive layer for jig 5 are cut, and the sheet for die-bonding layer formation 3 can thereby have the structure as illustrated in FIG. 2.

4. Another Embodiment of Sheet for Die-bonding Layer Formation

Figure 3:
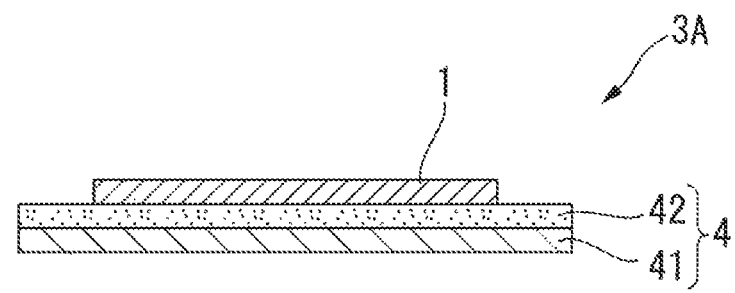
FIG. 3 is a cross-sectional view of a sheet for die-bonding layer formation according to a further embodiment of the present embodiment.
Figure 4:
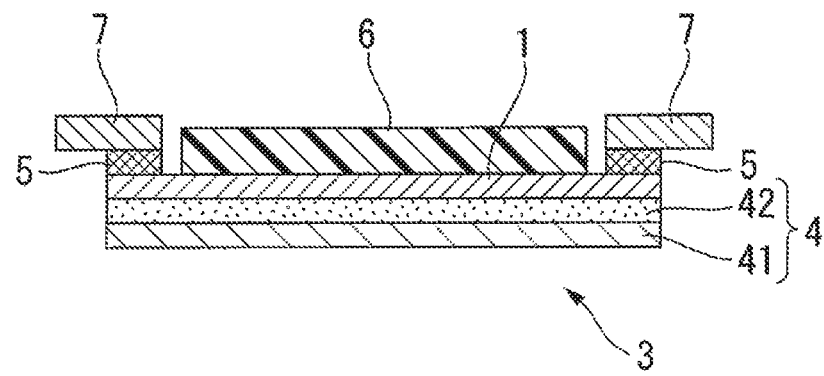
FIG. 4 is a cross-sectional view illustrating a use example of a sheet for die-bonding layer formation according to an embodiment of the present embodiment, specifically illustrating a first laminate structure.

FIG. 3 is a cross-sectional view of a sheet for die-bonding layer formation according to a further embodiment of the present embodiment. As illustrated in FIG. 3, the sheet for die-bonding layer formation 3A according to the present embodiment is configured to comprise: a pressure sensitive adhesive sheet 4 in which a pressure sensitive adhesive layer 42 is laminated on one surface of a base material 41; and a die-bonding layer formation film 1 laminated on the pressure sensitive adhesive sheet 4 at the side of the pressure sensitive adhesive layer 42. The die-bonding layer formation film 1 in the embodiment may be formed to have substantially the same size as that of a workpiece in the surface direction or formed slightly larger than a workpiece and formed smaller than the pressure sensitive adhesive sheet 4 in the surface direction. The portion of the pressure sensitive adhesive layer 42 on which the die-bonding layer formation film 1 is not laminated can be attached to a jig such as a ring frame.

The material, thickness and other factors of each member of the sheet for die-bonding layer formation 3A according to the present embodiment may be the same as those of each member of the previously-described sheet for die-bonding layer formation 3. When the pressure sensitive adhesive layer 42 comprises an energy ray curable pressure sensitive adhesive, however, it may be preferred that the energy ray curable pressure sensitive adhesive is cured in a portion of the pressure sensitive adhesive layer 42 which comes into contact with the die-bonding layer formation film 1 while the energy ray curable pressure sensitive adhesive is not cured in the other portion. The material in which the energy ray curable pressure sensitive adhesive is cured may ordinarily have high elastic modulus and high flatness of the surface, and therefore the sheet for die-bonding layer formation 3A is ready to effectively function as a dicing sheet.

A pressure sensitive adhesive layer for jig similar to the previously-described pressure sensitive adhesive layer for jig 5 of the sheet for die-bonding layer formation 3 may be additionally provided on the outer edge portion of the pressure sensitive adhesive layer 42 of the pressure sensitive adhesive sheet 4 of the sheet for die-bonding layer formation 3A at the opposite side to the base material 41.

5. Processed Product and Semiconductor Device

The description will then be directed to a method of manufacturing a processed product from a workpiece using the sheet for die-bonding layer formation 3 or 3A according to the present embodiment and a method of manufacturing a semiconductor device using the processed product.

The die-bonding layer formation film 1 of the sheet for die-bonding layer formation 3 according to the present embodiment may be attached to a workpiece, and the workpiece may be divided and processed into processed products. Each processed product may be released from the pressure sensitive adhesive sheet 4 in a state in which the die-bonding layer formation film 1 attaches to either surface of the processed product, and the processed product attached thereto with the die-bonding layer formation film 1 can thus be obtained.

The workpiece may be a silicon wafer, and other examples of the workpiece include various articles, such as semiconductor wafers of gallium/arsenide and other compounds, glass substrates, ceramic substrates, FPC boards and other organic material boards, and precision components and other metal materials. In the following description, a case when using a semiconductor wafer as a workpiece will be described as a primary example.

Formation of circuits on the wafer surface can be performed by various methods including the conventionally and generally used methods, such as an etching method and liftoff method. The opposite surface (back surface) of the wafer to the circuit surface may then be ground. The grinding method is not particularly limited, and the grinding may be performed by known means, such as using a grinder. When grinding the back surface, a pressure sensitive adhesive sheet called as a surface protection sheet may be attached to the circuit surface in order to protect the circuits on the front surface. In the back surface grinding, the circuit surface side (i.e. the side of the surface protection sheet) of the wafer may be fixed to a chuck table or the like, and the back surface side on which circuits are not formed may be ground using a grinder. The thickness after grinding of the wafer may be, but is not particularly limited to, about 50 to 500 μm.

Thereafter, a damaged layer caused when grinding the back surface may be removed as necessary. Removal of the damaged layer may be performed by chemical etching, plasma etching, or other appropriate means.

The circuit formation and back surface grinding may be followed by attaching the die-bonding layer formation film 1 of the sheet for die-bonding layer formation 3 to the back surface of the wafer. The attaching method is not particularly limited. For example, the back surface side of the semiconductor wafer may be placed on and moderately pressed against the die-bonding layer formation film 1 of the sheet for die-bonding layer formation 3 to fix the semiconductor wafer. The sheet for die-bonding layer formation 3 may be fixed to a jig such as a ring frame at the outer circumferential portion of the sheet for die-bonding layer formation 3.

When the die-bonding layer formation film 1 does not have pressure sensitivity, it may be appropriately heated (the heating temperature may preferably be, but is not limited to, 40° C. to 80° C.).

Subsequently, the die-bonding layer formation film 1 may be irradiated with an energy ray from the pressure sensitive adhesive sheet side to cure the epoxy compound having a reactive double bond group, for example, owing to the reaction of the reactive double bond group. This reaction may enhance the cohesive force of the adhesive layer of the die-bonding layer formation film 1 to reduce the adhesion force between the die-bonding layer formation film 1 and the pressure sensitive adhesive sheet. Examples of the energy ray used for irradiation include ultraviolet ray (UV) and electron beam (EB), and the ultraviolet ray may preferably be used.

Thereafter, the semiconductor wafer may be cut to obtain semiconductor chips, such as by a blade dicing method using a dicing saw and a laser dicing method using laser beam. The depth of cutting when using a dicing saw may be a depth that is determined in consideration of the total thickness of the semiconductor wafer and die-bonding layer formation film 1 as well as the wear amount of the dicing saw, so that the die-bonding layer formation film 1 may also be cut into pieces each having the same size as that of the chips. A different method than the above dividing methods may also be employed as follows. A workpiece is irradiated with laser beam having a large numerical aperture (NA) so that a modified layer is preliminarily formed inside the workpiece while minimizing the damage received by the workpiece in the vicinity of the surface, and thereafter the workpiece is applied with some force to obtain small plate-like pieces as the processed products, such as in the expanding step. This method may be called "modified layer destruction-type tensile division."

The energy ray irradiation may be performed in any stage after the attaching of semiconductor wafer and before the release (pickup) of semiconductor chips. For example, the energy ray irradiation may be performed after the dicing or may also be performed after the expanding step to be described below. In an alternative embodiment, the energy ray irradiation may be performed several times.

Subsequently, expanding of the sheet for die-bonding layer formation 3 may be performed, if necessary, to expand the distance between adjacent semiconductor chips. This allows the semiconductor chips to be further easily picked up. During this operation, some slippage may occur between the die-bonding layer formation film 1 and the pressure sensitive adhesive sheet to reduce the adhesion force therebetween, and the suitability for pickup of the semiconductor chips can be improved. When pickup of the semiconductor chips is performed in such a manner, each semiconductor chip can be released from the pressure sensitive adhesive sheet so that the die-bonding layer formation film 1 having been cut can be fixed to and remain on the back surface of the semiconductor chip. The processed product attached thereto with the die-bonding layer formation film 1 can thus be obtained. If, in this step, the modified layer destruction-type tensile division is carried out, the expanding may be performed while maintaining the temperature of the die-bonding layer formation film 1 at a low temperature, such as a temperature lower than 10° C. Maintaining the temperature of the die-bonding layer formation film 1 at a low temperature makes it easy to divide the workpiece as well as to divide the die-bonding layer formation film 1 during the expanding.

Then, the processed product attached thereto with the die-bonding layer formation film 1 may be placed on an adherend so that the die-bonding layer formation film 1 is positioned between the adherend and the processed product. Examples of the adherend include a circuit substrate, lead frame (of which the adherend surface is the die pad area), and another semiconductor chip. The adherend may be heated before or after the semiconductor chip is placed thereon, or may also be heated immediately after the chip is placed. The heating temperature may ordinarily be 80° C. to 200° C. and preferably 100° C. to 180° C., and the heating time may ordinarily be 0.1 seconds to 5 minute and preferably 0.5 seconds to 3 minutes. The pressure when placing the chip may ordinarily be 1 kPa to 200 MPa.

After the semiconductor chip is laminated on the adherend as described above, further heating may be performed if necessary. This heating may be performed, for example, during the wire bonding which will next be described. If the production line stops, such as during the wire bonding step, the heating time may be extended to about 1 to 5 hours. The adhesive layer of the die-bonding layer formation film 1 according to the present embodiment is excellent in the thermal history resistance. Therefore, even if such excessive heating causes bubbles (voids) between the adhesive layer and the adherend, the bubbles (voids) can be allowed to readily disappear before the die-bonding layer is formed from the die-bonding layer formation film 1.

Wire bonding may be performed for a member obtained by the above method, in which the semiconductor chip is laminated on the adherend, to connect the adherend and semiconductor chip included in the member by wirings. During this wire bonding, the temperature of the die-bonding layer formation film 1 positioned between the adherend and the semiconductor chip may be raised to about 170° C. to 180° C., but the adhesive layer of the die-bonding layer formation film 1 satisfies the condition in regard to the previously-described local minimum elasticity temperature, and therefore troubles in the wire bonding are unlikely to occur, such as that the bonding strength of the bonding wires is reduced.

Thereafter, the adhesive layer of the die-bonding layer formation film 1 may be finally cured to obtain a semiconductor device that has a structure in which the processed product and the adherend are laminated via the die-bonding layer. The semiconductor device includes wires that connect the processed product and adherend. The heating condition for the final curing may be appropriately set in accordance with the composition of the adhesive layer. In view of improving the productivity, the heating for the final curing may be performed by the heating in association with the resin sealing, which may ordinarily be performed in the package production for semiconductor devices. A laminate structure may be obtained such that a processed product laminated on an adherend is used as another adherend and another processed product is laminated thereon, and this operation may be further repeated as necessary. In such a case, the adhesive layers of the die-bonding layer formation films 1 in the laminate structure thus obtained may be finally cured by the heating in association with the resin sealing, which may ordinarily be performed in the package production for the laminate structure. Through such steps, the adhesive layers of the die-bonding layer formation films 1 can be concurrently cured, and the production efficiency of semiconductor devices can be improved.

As described above, the die-bonding layer formation film 1 according to an embodiment of the present invention can be used to stably perform the wire bonding because the adhesive layer has moderate hardness to some extent during the wire bonding. Moreover, the adhesive layer of the die-bonding layer formation film 1 is excellent in the thermal history resistance, so that voids are unlikely to remain between the die-bonding layer and the adherend, and the package reliability can thus be enhanced.

The embodiments heretofore explained are described to facilitate understanding of the present invention and are not described to limit the present invention. Therefore, it is intended that the elements disclosed in the above embodiments include all design changes and equivalents to fall within the technical scope of the present invention.

For example, a release sheet may be laminated on the die-bonding layer formation film 1 of the sheet for die-bonding layer formation 3 or 3A at the opposite side to the pressure sensitive adhesive sheet 4.

EXAMPLES

Hereinafter, the present invention will be described further specifically with reference to examples, etc., but the scope of the present invention is not limited to these examples, etc.

Example 1

A composition for coating for forming an adhesive layer was prepared by mixing the components below at a compounding ratio as listed in Table 1 (numerals in each column represent solid content equivalent mass parts) and diluting the components with methyl ethyl ketone.

Acrylic polymer (A1):

(A1-1) copolymer of methyl acrylate (MA) and hydroxyethyl acrylate (HEA) (mass ratio: MA/HEA=95/5), weight-average molecular weight of 500,000, available from TOYOCHEM CO., LTD., glass transition temperature of 9° C.

(A1-2) copolymer of methyl acrylate (MA) and hydroxyethyl acrylate (HEA) (mass ratio: MA/HEA=85/15), weight-average molecular weight of 400,000, available from The Nippon Synthetic Chemical Industry Co., Ltd., glass transition temperature of 6° C.

Epoxy compound (B1): acryloyl group-added cresol novolac-type epoxy resin ("CNA-147" available from Nippon Kayaku Co., Ltd.)

Thermosetting agent (B2): aralkyl phenol resin ("MILEX XLC-4L" available from Mitsui Chemicals, Inc.)

Filler (C): methacryloxy group-modified silica filler (average particle diameter of 0.5 μm, "SO-C2" available from Admatechs Company Limited, 3-methacryloxypropyltrimethoxysilane-treated product)

Coupling agent (D): silane coupling agent ("MKC Silicate MSEP2" available from Mitsubishi Chemical Corporation)

Cross-linker (E): aromatic polyvalent isocyanate ("Coronate L" available from Nippon Polyurethane Industry Co., Ltd.)

Note that the "CNA-147" available from Nippon Kayaku Co., Ltd. contains a phosphorus-based curing accelerator as the curing accelerator (B3).

A first release sheet was prepared such that a silicone-based release agent layer was formed on either one surface of a polyethylene terephthalate (PET) film. The release surface of the first release sheet was coated with the above composition for coating, which was then dried in an oven at 120° C. for 3 minutes to form an adhesive layer. The thickness of the finally obtained die-bonding layer formation film was 20 μm. A second release sheet was prepared such that a silicone-based release agent layer was formed on either one surface of a polyethylene terephthalate (PET) film. The release surface of the second release sheet was attached to the adhesive layer obtained in the above manner, and a sheet for die-bonding layer formation was thus obtained, comprising the first release sheet (release sheet 21 in FIG. 1), a die-bonding layer formation film formed of the adhesive layer (die-bonding layer formation film 1 in FIG. 1) (thickness: 20 μm), and the second release sheet.

One release sheet was removed from the above sheet for die-bonding layer formation, the exposed surface of the adhesive layer was attached to the surface of a pressure sensitive adhesive layer of a dicing sheet ("G-562" available from LINTEC Corporation), and the other release sheet of the above sheet for die-bonding layer formation was removed. The die-bonding layer formation film was thereby transferred onto the pressure sensitive adhesive layer of the dicing sheet. In this manner, a raw sheet of a sheet for die-bonding layer formation was obtained, having the same laminate structure as that of the sheet for die-bonding layer formation illustrated in FIG. 1.

In this example, a pressure sensitive adhesive layer for jig was further laminated on the above raw sheet of a sheet for die-bonding layer formation to produce a sheet for die-bonding layer formation having the structure as illustrated in FIG. 2. First, a double-sided tape, which was configured such that acrylic-based pressure sensitive adhesives of a thickness of 5 μm were provided on both surfaces of a polypropylene film of a thickness of 40 μm, was prepared in a state of being interposed between two release sheets, and the double-sided tape was punched and cut, with the release sheet at one side, into a circular shape of 165 mm. The whole surface of the punched release sheet and the inner portion of the double-sided tape punched into a circular shape were removed, and a double-sided tape having a circular lost portion was obtained on the other release sheet. Thereafter, the pressure sensitive adhesive of the double-sided tape having the circular lost portion was attached to the die-bonding layer formation film of the above raw sheet of a sheet for die-bonding layer formation. Subsequently, the laminate of the double-sided tape and raw sheet of a sheet for die-bonding layer formation was punched and cut into a circular shape of 207 mm concentrically with the punched shape of the double-sided tape. In this manner, a sheet for die-bonding layer formation having a pressure sensitive adhesive layer for jig formed of the annular double-sided tape for attaching a ring frame, i.e. having the structure of FIG. 2, was obtained on the release sheet.

Examples 2 to 6 and Comparative Examples 1 and 2

Sheets for die-bonding layer formation having the structure of FIG. 2 were produced in the same manner as in Example 1 except that the type and compounding amount of components compounded for forming each adhesive layer were changed as listed in Table 1.

Exemplary Test 1 <Measurement of Elastic Modulus Profile>

A set of adhesive layers was produced additionally to each of the examples and comparative examples, and the obtained adhesive layers were laminated to a thickness of 400 μm. Thereafter, elastic moduli (storage elastic moduli and loss elastic moduli) within a temperature region of 0° C. to 300° C. were measured at a measurement frequency of 11 Hz and a temperature rise rate of 3° C./min using a dynamic viscoelasticity measuring apparatus ("DMA Q800" available from TA Instruments) to obtain an elastic modulus profile. This elastic modulus profile was used to obtain a local minimum elasticity temperature. Results are listed in Table 1.

Exemplary Test 2 <Measurement of High-temperature Shear>Strength

The sheet for die-bonding layer formation produced in each of the examples and comparative examples and having the structure as illustrated in FIG. 2 was attached to a 6-inch size silicon wafer having a thickness of 350 μm and #2000 polished, while being heated to 60° C., using a tape mounter ("Adwill RAD-2700F/12" available from LINTEC Corporation). The pressure sensitive adhesive layer for jig of the sheet for die-bonding layer formation was attached to a ring frame. Thereafter, the silicon wafer attached thereto with the sheet for die-bonding layer formation was diced to a size of 2 mm×2 mm using a dicing apparatus ("DFD651" available from DISCO Corporation). A substrate (peeling strength test substrate "V5" available from CHINO GIKEN CORPORATION, size of package unit: 50 mm×150 mm×1.0 mm thickness, material: FR-4) having a solder resist ("PSR-4000 AUS303" available from TAIYO INK MFG. CO., LTD.) was prepared. Chips obtained by the above dicing were die-bonded to the surface of the substrate provided thereon with the solder resist under a condition of a temperature of 150° C., a pressurizing force of 100 gf and a pressurizing time of 1 second so that the sheet for die-bonding layer formation would be positioned between the substrate and the chips. The laminate structure obtained by the die bonding and comprising the chips, the sheet for die-bonding layer formation and the substrate was heated in an oven at 175° C. for 1 hour to thermally cure the adhesive layers of the sheet for die-bonding layer formation and then heated at a temperature of 250° C. for 30 seconds using a bond tester ("Bondtester DAGE4000 series" available from Nordson DAGE Company), and thereafter the shear adhesion strength was measured in accordance with MIL-STD-883J (METHOD 2019.9). The measurement results thus obtained of the high-temperature shear strength are listed in Table 1.

Exemplary Test 3 <Evaluation of Thermal History Resistance>

(1) Production of Semiconductor Chips

The sheet for die-bonding layer formation produced in each of the examples and comparative examples and having the structure as illustrated in FIG. 2 was attached to the polished surface of a 6-inch size silicon wafer finished by dry polishing (thickness of 75 μm) using a tape mounter ("Adwill RAD-2700F/12" available from LINTEC Corporation), and the silicon wafer was fixed to a ring frame for wafer dicing via the sheet for die-bonding layer formation. Subsequently, the silicon wafer on the sheet for die-bonding layer formation was diced to a chip size of 8 mm×8 mm using a dicing apparatus ("DFD651" available from DISCO Corporation). The dicing was performed to cut into the base material by a depth of 20 μm.

(2) Production of Semiconductor Packages

A substrate ("LN001E-001 PCB(Au)AUS303" available from CHINO GIKEN CORPORATION) was prepared as a substrate for evaluation, in which circuit patterns were formed using the copper foil (thickness of 18 μm) of a copper-clad laminate ("CCL-HL830" available from MITSUBISHI GAS CHEMICAL COMPANY, INC.) and the patterns were covered with a solder resist ("PSR-4000 AUS303" available from TAIYO INK MFG. CO., LTD).

Chips on the sheet for die-bonding layer formation and obtained in the above (1) were picked up, with the adhesive layers of the die-bonding layer formation films, from the dicing sheet. The obtained chips attached thereto with the die-bonding layer formation films were laminated on and fixed to the above substrate via the die-bonding layer formation films by applying pressure under a condition of a temperature of 120° C., a pressurizing force of 250 gf and a pressurizing time of 0.5 seconds. The laminate structure obtained by this pressure fixation and comprising the chips, the die-bonding layer formation films and the substrate was put in an oven maintained at 175° C. and subjected to thermal history of each of different six conditions of 1 hour, 2 hours, 3 hours, 4 hours, 5 hours, and 6 hours.

Each laminate structure subjected to the thermal history was sealed with a mold resin ("KE-1100AS3" available from KYOCERA Chemical Corporation) to have a sealing thickness of 400 μm (sealing apparatus: "MPC-06M TriAl Press" available from APIC YAMADA CORPORATION), and maintained at an temperature of 175° C. for 5 hours to cure the sealing resin. A dicing tape ("Adwill D-510T" available from LINTEC Corporation) was attached to the member thus obtained and sealed therein with the laminate structure, and this dicing tape was further attached to a ring frame. The member was then diced to a size of 15 mm×15 mm using a dicing apparatus ("DFD651" available from DISCO Corporation) to obtain semiconductor packages for reliability evaluation.

(3) Evaluation of Surface Mounting Property of Semiconductor Packages (Package Reliability)

The semiconductor packages obtained in the above (2) were stationarily placed under an environment of 85° C. and a relative humidity of 60% for 168 hours to absorb moisture, and thereafter IR reflow of a maximum temperature of 260° C. and a heating time of 1 minute was performed three times (reflow furnace: "WL-15-20DNX type" available from Sagami-Rikou Co. Ltd).

For these semiconductor packages after the reflow process, the presence or absence of lifting/delamination of the bonded parts and the presence or absence of the occurrence of package cracks were evaluated by using a scanning-type ultrasonic testing apparatus ("Hye-Focus" available from Hitachi Construction Machinery Co., Ltd) and by cross-section observation. When delamination of 0.5 mm or more was observed at a bonded part between the substrate and a semiconductor chip, it was determined that delamination occurred at the bonded part. When 25 semiconductor packages were put to the test and delamination occurred at the bonded part of at least one semiconductor package, the reliability evaluation was determined to be bad.

Then, the longest time in the thermal history conditions during which the bad reliability evaluation did not occur (the minimum time was 0 hours and the maximum time was 6 hours) was employed as the evaluation result of the thermal history resistance. In this evaluation, as the longest time in the thermal history conditions during which the bad reliability evaluation did not occur increases, the thermal history resistance can be determined to be improved.

Exemplary Test 4 <Evaluation of Suitability for Wire Bonding>

The sheet for die-bonding layer formation produced in each of the examples and comparative examples and having the structure as illustrated in FIG. 2 was attached to the surface without deposited aluminum of a 6-inch size aluminum-deposited wafer having a thickness of 350 μm while being heated to 60° C., using a tape mounter ("Adwill RAD-2700F/12" available from LINTEC Corporation). The pressure sensitive adhesive layer for jig of the sheet for die-bonding layer formation was attached to a ring frame. Subsequently, the wafer was diced to a size of 2 mm×2 mm using a dicing apparatus ("DFD651" available from DISCO Corporation). Chips thus obtained and attached thereto with the die-bonding layer formation films were laminated on and fixed to the same type of a substrate as the substrate for evaluation used in Exemplary Test 3 via the die-bonding layer formation films by applying pressure under a condition of a temperature of 120° C., a pressurizing force of 250 gf and a pressurizing time of 0.5 seconds. Wire bonding was then performed to connect between the substrate and the chips using a wire bonder ("Maxum Plus" available from Kulicke & Soffa) and Cu wires ("Max soft 20 um" available from Heraeus Holding GmbH). The bonding condition was as follows:

Ultrasonic output: 90 mA
Bonding temperature: 175° C.
Bonding load: 17 g
Bonding time: 10 ms After the wire bonding, the shear strength was measured using a bond tester ("Bondtester DAGE4000 series" available from Nordson DAGE Company) in accordance with JEITA ED-4703. Measurement results are listed in Table 1. When the shear strength is 10 g or more, the suitability for wire bonding can be determined to be good.

TABLE 1

| | | Example 1 | Example 2 | Example 3 | Example 4 | Example 5 | Example 6 | Comparative example 1 | Comparative example 2 |
|---|---|---|---|---|---|---|---|---|---|
| Components | (A1-1) | 100 | 100 | 100 | 100 | — | 100 | 100 | 100 |
| | (A1-2) | — | — | — | — | 100 | — | — | — |
| | (B1) | 30 | 30 | 10 | 20 | 30 | 5 | 40 | 3 |
| | (B2) | 6 | 6 | 2 | 4 | 6 | 1 | 8 | 1 |
| | (C) | 35 | — | 28 | 31 | 35 | — | 37 | 28 |
| | (D) | 0.5 | 0.5 | 0.5 | 0.5 | 0.5 | 0.5 | 0.5 | 0.5 |
| | (E) | 1.5 | 1.5 | 1.5 | 1.5 | 1.5 | 1.5 | 1.5 | 1.5 |
| Local minimum elasticity temperature | °C. | 140 | 132 | 90 | 110 | 125 | 145 | 130 | 160 |
| High-temperature shear strength | N/2 mm□ | 42 | 37 | 28 | 33 | 47 | 22 | 55 | 17 |
| Thermal history resistance | hours | 3 | 1 | 5 | 4 | 3 | 4 | 0 | 1 |
| Suitability for wire bonding | g | 17 | 16 | 14 | 16 | 18 | 12 | 19 | 8 |

As found from Table 1, the adhesive layers of the die-bonding layer formation films of the examples according to the present invention are excellent in the thermal history resistance and also excellent in the suitability for wire bonding.

INDUSTRIAL APPLICABILITY

The die-bonding layer formation film according to the present invention can be suitably used for manufacturing semiconductor devices from chips obtained by division processing of a semiconductor wafer.

DESCRIPTION OF REFERENCE NUMERALS

1 . . . Die-bonding layer formation film
2 . . . Sheet for die-bonding layer formation
21 . . . Release sheet
3, 3A . . . Sheet for die-bonding layer formation
4 . . . Pressure sensitive adhesive sheet
41 . . . Base material
42 . . . Pressure sensitive adhesive layer
5 . . . Pressure sensitive adhesive layer for jig
6 . . . Semiconductor wafer
7 . . . Ring frame

The invention claimed is:

1. A die-bonding layer formation film to be used for fixing a processed product to an adherend,
the processed product being obtained by processing a workpiece, the die-bonding layer formation film comprising an adhesive layer,
wherein, when a temperature dependency of a storage elastic modulus of the adhesive layer is measured, the storage elastic modulus has a local minimum value at a temperature within a range of 80° C. to 150° C.,
wherein the adhesive layer has a shear strength to a peeling strength test substrate of 20 N/(2 mm×2 mm) to 50 N/(2 mm×2 mm), wherein the shear strength is measured after the processed product is placed above the peeling strength test substrate via the die-bonding layer formation film, and the die-bonding layer formation film on the peeling strength test substrate is heated at 175° C. for 1 hour and then further maintained under an environment of 250° C. for 30 seconds.

2. The die-bonding layer formation film as recited in claim 1, wherein the adhesive layer comprises a binder component that contains a polymer component, a curable component, and a curing accelerator,
wherein a mass ratio of a total amount of the polymer component, the curable component, and the curing accelerator in the binder component to a mass of the adhesive layer as a whole is 95 mass % or more.

3. The die-bonding layer formation film as recited in claim 1, wherein the die-bonding layer formation film is an adhesive film for die bonding that is used for adhesion of a semiconductor chip to a die mounting part.

4. A processed product having a die-bonding layer formation film attached thereto, wherein the processed product is manufactured using the die-bonding layer formation film as recited in claim 1.

5. A semiconductor device manufactured using the processed product having a die-bonding layer formation film attached thereto as recited in claim 4, the semiconductor device having a structure in which the processed product and an adherend are laminated via a die-bonding layer, the semiconductor device comprising a wire for connection between the processed product and the adherend.

* * * * *